United States Patent [19]

Bohler

[11] Patent Number: 5,602,475

[45] Date of Patent: Feb. 11, 1997

[54] LASER PUMPED MAGNETOMETER

[75] Inventor: Christopher L. Bohler, Allen, Tex.

[73] Assignee: Texas Instruments Incorporated, Dallas, Tex.

[21] Appl. No.: 222,151

[22] Filed: Apr. 4, 1994

[51] Int. Cl.$^6$ .................................................. G01R 33/24
[52] U.S. Cl. ............................................ 324/301; 324/304
[58] Field of Search ..................................... 324/300, 301, 324/302, 304, 305

[56] References Cited

U.S. PATENT DOCUMENTS

| | | | |
|---|---|---|---|
| 3,718,868 | 2/1973 | Pao et al. | 324/305 |
| 4,525,672 | 6/1985 | Lam et al. | 324/304 |
| 4,780,672 | 10/1988 | McGregor | 324/304 |
| 4,806,864 | 2/1989 | Schearer et al. | 324/301 |
| 5,036,278 | 7/1991 | Slocum | 324/304 |
| 5,053,708 | 10/1991 | Aspect et al. | 324/304 |
| 5,436,561 | 7/1995 | Leger | 324/301 |

FOREIGN PATENT DOCUMENTS

| | | | |
|---|---|---|---|
| 0117438 | 6/1986 | Japan | 324/304 |
| 0117439 | 6/1986 | Japan | 324/304 |

Primary Examiner—Sandra L. O'Shea
Assistant Examiner—Raymond Y. Mah
Attorney, Agent, or Firm—Rene' E. Grossman; Richard L. Donaldson

[57] ABSTRACT

A single-mode semiconductor laser for optical pumping in $H^e$ and $^4He$ and high-sensitivity magnetometers based upon these systems. A distributed Bragg reflection (DBR) or distributed feedback (DFB) single mode, preferably InGaAs laser diode (1) which obviates the need for optomechanical arrangements and their inherent instabilities as required by the prior art laser pumped magnetometers. By constructing a DBR or DFB region (28) within the laser diode structure, the laser is forced to operate within a single-mode at a wavelength that is jointly determined by the gain of the laser medium and feedback from the Bragg grating. This wavelength is controllable in one of three ways: (1) temperature control (13) of the laser diode junction and grating, (2) injection current control (12) within the gain region, (3) current control (11) of the Bragg grating region or any combination of the three. An alternative approach is to use the Fabry-Perot device and introduce an external grating control, if proper coatings are applied to the laser faces.

22 Claims, 1 Drawing Sheet

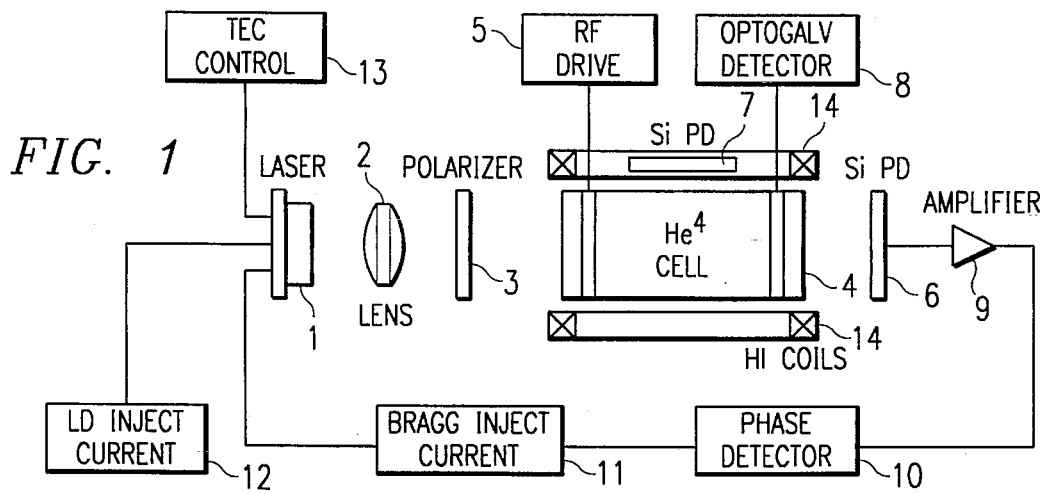
FIG. 1
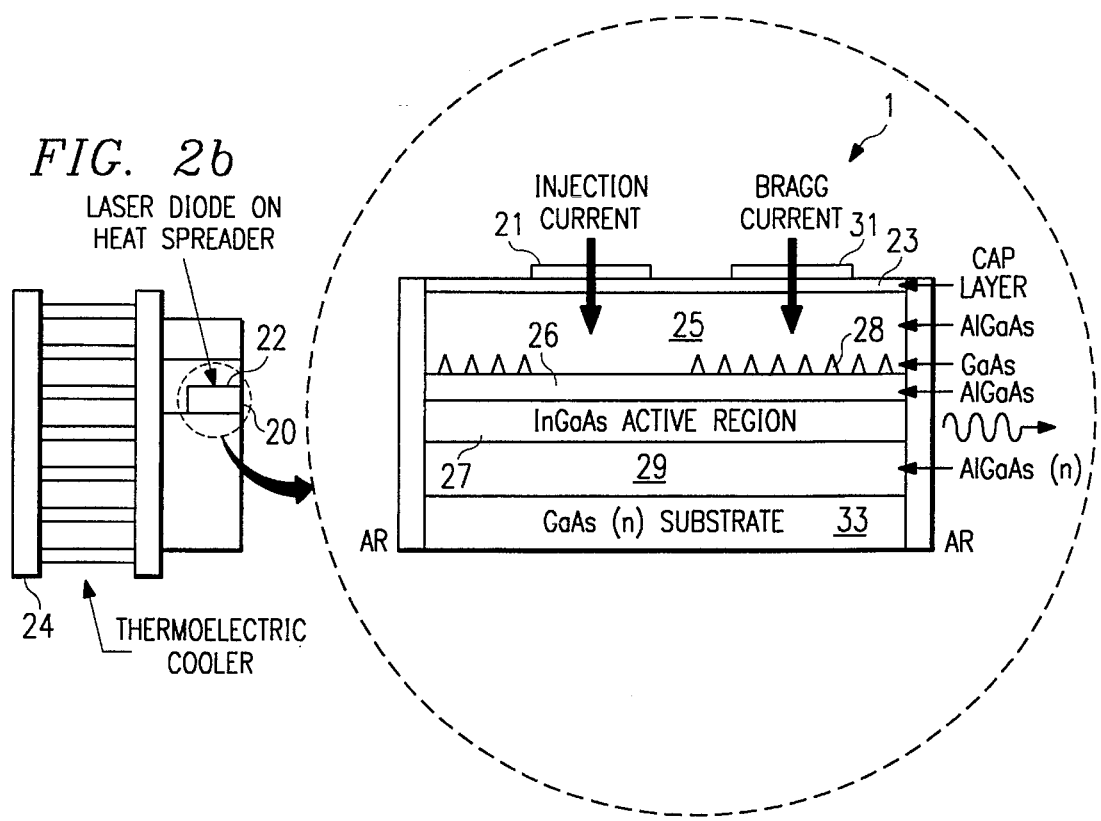
FIG. 2a
FIG. 2b
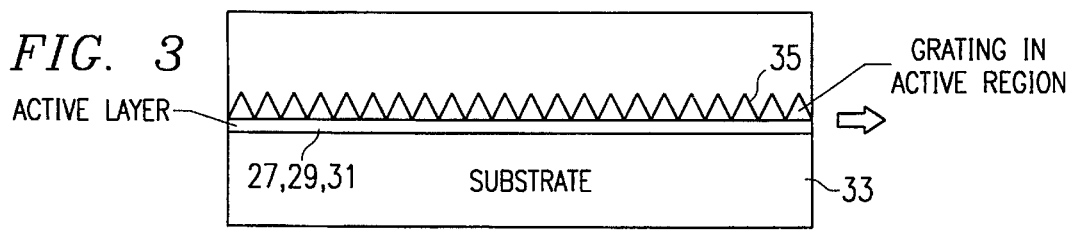
FIG. 3

LASER PUMPED MAGNETOMETER

BACKGROUND OF THE INVENTION

1. Field of the Invention

This invention relates to magnetometers and, more particularly, to driven helium magnetometers.

2. Brief Description of the Prior Art

Magnetometers are devices for sensing magnetic fields, generally weak magnetic fields, wherein energy and angular momentum are transferred from a light source to a cell containing an isotope of helium ($^3$He or $^4$He). The $^4$He methodology will be described here with the understanding that the laser source can be applied to the $^3$He system as well. The $^3$He and $^4$He systems differ in that $^4$He exhibits an "electron spin resonance" which is monitored as described below. $^3$He, on the other hand, exhibits a nuclear magnetic resonance which is monitored via a set of pick-up coils in which an electromotive force has been induced as a result of the atoms precessing in the magnetic field. The $^4$He approach to be described places more stringent tolerances upon the laser characteristics, particularly in terms of its amplitude and frequency stability. Otherwise, the laser diode requirements are much the same. The impingement of the light onto the helium isotope, in concert with an electrical discharge, causes the isotope to have magnetic sensitivity, such as sensitivity to changes in the magnetic field of the earth, passing metallic objects, such as submarines, and the like. The helium atoms precess at known frequencies for different magnetic fields. The transparency of the helium cell at 1082.9 nm. with $^4$He is a function of the optical resonance of the atoms within the helium cell. A radiation detector positioned on an axis containing the helium cell and across the cell from the light source detects the light when transmitted through the helium cell and produces an electrical signal in response to the intensity of the transmitted light. The optical resonance of the helium cell is modulated by a voltage controlled oscillator (VCO) which provides a variable output frequency to a pair of coils positioned on the sides of the helium cell and electrically connected to the VCO to receive the variable output frequency. The pair of coils produces a variable magnetic field at the precession frequency of the helium metastable isotope that is mathematically related to the magnetic field that is being measured and is thus in resonance with the precession of the atoms within the helium cell. A feedback loop includes a demodulation circuit that is electrically connected between the radiation detector and the VCO and demodulates the electrical signal from the radiation detector to produce a drive voltage for driving the VCO. A frequency counter counts the output signal from the VCO with the magnetic field that the magnetometer is measuring being mathematically related to the measured frequency.

There are two typical radiation sources used for optical pumping of a magnetometer based upon a helium isotope resonance cell, these being helium lamps and lasers. Conventional commercial helium isotope magnetometers use a helium lamp as a source of optical radiation for optically pumping the resonance cell and for optically observing the state of the helium isotope sample in the resonance cell. There are several disadvantages associated with the lamp pumping technique. The lamp radiation intensity is less than optimum for many applications and the lamp radiation contains spectral lines corresponding to the $2^3S_1$-$2^3P_0$, $2^3S_1$-$2^3P_1$ and $2^3S_1$-$2^3P_2$ transitions of $^4$He. These spectral lines derive from transitions between the triplet P energy levels and the triplet S energy levels and have center wavelengths of 1082.91 nm, 1083.01 nm and 1083,03 Din, respectively. Radiation of all three transitional wavelengths combined is less effective than radiation of one transitional wavelength.

It has been recognized that a single line laser radiation source could overcome the disadvantages of helium lamp pumping. However, no laser had been recognized as being suitable for this purpose. Prior art attempts in this direction are set forth in the patents of McGregor (U.S. Pat. No. 4,780,672), Schearer et al. (U.S. Pat. No. 4,806,864) and Slocum (U.S. Pat. No. 5,036,278), however none are known to have been commercially successful. The apparent problem with the prior art laser approach is that the issues of stability and control of the source with respect to the optical pumping lines are not addressed. It is imperative that the frequency of the laser light be locked to a particular one of the absorption lines of the helium, ell in order to provide a high sensitivity magnetometer. Of the above noted prior art, McGregor-does not discuss the subject of laser stability or provide a detailed description of the laser source to be used. Schearer et al. proposes a solid state laser solution to allow for high sensitivity operation of a helium magnetometer, however, due to the frequency discrimination in that system, it is optomechanical in nature and has inherent instabilities. Slocum discusses the use of a semiconductor laser for helium optical pumping. However, from a magnetometer standpoint, his use of a temperature-cooled, current controlled, Fabry-Perot laser diode would not allow for a high sensitivity laser pumped magnetometer due predominantly to mode competition and other sources of frequency and amplitude instability inherent in a Fabry-Perot laser diode.

SUMMARY OF THE INVENTION

In accordance with the present invention, there is provided a light source for optically pumping a magnetometer which provides a single line source which is stable and controllable with respect to the optical pumping lines. A preferred single line source is a single-mode semiconductor laser for optical pumping in $^3$He and $^4$He and high-sensitivity magnetometers based upon these systems.

More specifically, in accordance with the preferred embodiments, there is provided a distributed Bragg reflection (DBR) or distributed feedback (DFB) single mode InGaAs laser diode which obviates the need for optomechanical arrangements and their inherent instabilities as required by the prior art laser pumped magnetometers. The only other presently know laser diode which can be used is InGaAsP, but this laser must be cooled to the temperature of liquid nitrogen to be useful. By constructing a DBR or DFB region within the laser diode structure, the laser is forced to operate within a single-mode at a wavelength that is jointly determined by the gain of the laser medium (InGaAs in the preferred embodiment) and feedback from the Bragg grating. This wavelength is controllable in one of three ways: (1) temperature control of the laser diode junction and grating, (2) injection current control within the gain region, (3) current control the Bragg grating region or any combination of the three.

An alternative approach is to use the Fabry-Perot device as set forth by Slocum in the above noted patent and introduces an external grating control if proper coatings are applied to the laser faces. However, this approach would also introduce unwanted optomechanical instabilities as was the case with the prior art solid state laser approach.

Briefly, a magnetometer is provided having a single-mode semiconductor laser having stable wavelength and narrow bandwidth. The laser is provided by fabricating preferably a distributed Bragg reflection (DBR) or a distributed feedback (DFB) structure into the laser diode structure. The semiconductor laser package preferably includes the laser diode chip, a heat spreader, thermoelectric cooler, monitor photodiode and thermistor for monitoring the temperature of the package, all well known in the art. An output lens collimates the highly polarized laser diode light which can then, if required be further polarized by a polarizer, either linearly or circularly, depending upon the specific magnetometric configuration, and directed into a cell containing either $^3$He or $^4$He gas discharge. A discharge is created in the cell by applying RF radiation thereto via coils driven by an RF driver, thus exciting the helium atoms to a metastable level. The light from the laser is absorbed by the atoms in the cell when the laser wavelength matches the metastable resonances in the cell which are at about 1083 nm.

The magnetic resonance may be monitored by supplying an RF field using a coil referred to as $H_1$ at the Larmor frequency of the atoms in the ambient field. As a component of the RF field orthogonal to the ambient field is "swept" through resonance, the characteristics of the discharge change accordingly. This relationship may be described by $\omega=\gamma H_o$, where $\omega$ is the Larmor precession frequency of the atoms in the static magnetic field $H_o$ and $\gamma$ is the gyromagnetic ratio of the $^4$He metastable atoms. In this manner, the magnetic resonance appears as either a modulation of the absorption of the light traversing the cell and measured by a silicon photodiode, a modulation of the scattered light which is monitored by a silicon diode or monitoring can take place optogalvanically by measuring the impedance change in the cell itself via an optogalvanic detector. The signal is then amplified, phase detected with respect to the $H_1$ coil frequency and sent back to the RF $H_1$ coil out of phase in order to maintain the center of the magnetic resonance.

The mode of operation set forth above is also employed to "lock" the laser output to the atomic line of the metastable helium to be "pumped". In this particular embodiment, the light from the laser traversing the cell is measured by a silicon photodiode, amplified and sent to a phase detector referenced to a modulation current supplied by a Bragg current injector to the Bragg region of the laser. By applying a current to the Bragg region, the refractive index of the grating is changed slightly, thereby producing a frequency shift in the laser diode output on the order of 0.05 Å/mA. This method of frequency tuning is virtually free of residual amplitude modulation, which is not the case with other more traditional approaches. The DC output of the phase-sensitive detector is used to null the offset between the laser wavelength and the center of the helium absorption line being pumped. In this particular embodiment, the current supplied to the Bragg region is used to provide "fine" control of the laser wavelength. A thermoelectric cooler (TEC) controller which controls the temperature of the laser and the Bragg region is provided to "course" tune the laser to the desired atomic transition at a rate of approximately 1 Å/° C. while a laser diode injection current controller maintains the laser output power level. It is understood that the laser diode injection current controller or the TEC controller could be used to "lock" the laser onto the atomic transition as well. It is also understood that the radiation from the laser could be delivered to the cell via an optical fiber.

BRIEF DESCRIPTION OF THE DRAWINGS

FIG. 1 is a schematic diagram of a magnetometer system using the distributed Bragg reflection laser or the distributed feedback laser in accordance with the present invention;

FIG. 2a is a diagram of an InGaAs laser diode structure as used in accordance with the present invention;

FIG. 2b is a diagram of the laser of FIG. 2a disposed on a heat spreader coupled to a thermoelectric cooler; and FIG. 3 is a cross-sectional view of the distributed feedback laser embodiment of FIG. 2 showing the grating in the active region.

DESCRIPTION OF THE PREFERRED EMBODIMENT

Referring to FIG. 1, there is shown a preferred embodiment of the invention wherein a source of radiation in the form of a laser 1 for the laser-pumped magnetometer includes a single-mode semiconductor laser based upon the triternary InGaAs. Of paramount importance to the high sensitivity operation of the magnetometer is the laser wavelength stability and narrow linewidth of the laser output. This is provided by fabricating a distributed Bragg reflector (DBR) into the laser diode structure. The semiconductor laser package shown in FIG. 1 includes, as better shown in FIG. 2b, the laser diode chip, a heat spreader 22, thermoelectric cooler 24, as well as a monitor photodiode and thermistor for monitoring the temperature of the package, all of these being standard commercial devices.

An output lens 2 collimates the laser diode light which is then polarized by polarizer 3, either linearly or circularly, depending upon the specific magnetometric configuration, and directed into a cell 4 containing either $^3$He or $^4$He gas. A discharge is created in the cell by applying RF radiation to cell 4 via copper electrodes driven by RF driver 5, thus exciting the helium atoms to a metastable level. The laser light from laser 1 is then absorbed by the atoms in the cell 4 when the laser wavelength matches the metastable resonances at about 1083 nm.

In the case of $^4$He, the magnetic resonance may be monitored by supplying an RF field using the $H_1$ coils 14 at the Larmor frequency of the atoms in the ambient field. As the RF field is "swept" through resonance, the characteristics of the discharge change accordingly. In this manner, the magnetic resonance appears as either a modulation of the absorption of the light traversing the cell and measured by a silicon photodiode 6, a modulation of the scattered light which is monitored by a silicon diode 7 or monitoring can take place optogalvanically by measuring the impedance change in the cell 4 itself via an optogalvanic detector 8. Whichever method is chosen to monitor the resonance in the cell 4, the signal is then amplified, phase detected with respect to the $H_1$ coil frequency and sent back to the RF $H_1$ coil out of phase in order to maintain the center of the magnetic resonance.

The mode of operation set forth above is also employed to "lock" the laser output to the atomic line to be "pumped". As depicted in the example of FIG. 1, the light from the laser 1 traversing the cell 4 is measured by the silicon photodiode 6, amplified by the amplifier 9 and sent to a phase detector 10 referenced to a modulation current supplied by a Bragg current injector 11 to the Bragg region of the laser (to be explained in detail hereinbelow). The DC output of the phase-sensitive detector is used to null the offset between the laser wavelength and the center of the helium absorption line being pumped. In this particular embodiment, the current supplied to the Bragg region is used to provide "fine" control of the laser wavelength. A thermoelectric cooler control 13 is provided to "course" tune the laser to the desired atomic transition and the laser diode injection current controller 12 maintains the laser output power level. It is understood that the laser diode injection current controller 12 or the TEC controller 13 could be used to "lock" the laser 1 onto the atomic transition as well. It is also understood that the radiation from laser 1 could be delivered to the cell 4 via an optical fiber.

Referring now to FIG. 2a, there is shown the laser 1 of FIG. 1 having therein a frequency discriminator which permits the laser to lase at only one frequency. The laser is a standard InGaAs laser diode having embedded therein either a grating over the active region in which the light travels to provide a distributed feedback (DFB) laser as shown in FIG. 3 or a grating external to the injection region to provide a distributed Bragg reflection (DBR) laser as shown in FIG. 2. The laser structure of FIG. 2, which is of otherwise standard construction, includes a top injection current contact 21 for current from the LD Inject Current source 12 of FIG. 1 and a Bragg current contact 31 for current from the Bragg injection current circuit 11 of FIG. 1. As one possible embodiment, the contacts 21 and 31 rest upon a cap layer 23 of p+ GaAs. Beneath the cap layer 23 is a clad layer of p AlGaAs 25 which contains the grating 28 in the form of GaAs spikes on the bottom surface thereof. The clad layer 25 is disposed over a layer 26 of AlGaAs which is disposed over an active region of InGaAs 27. Beneath the active region 27 is a clad layer of n AlGaAs 29 under which is a substrate of n GaAs 33.

The grating 28 is in juxtaposition to the active layer 27. "Reflectivity" of the grating layer 27 provides feedback in the second order into the active region at peak response of the grating layer as determined by the grating layer pitch. As can be seen in FIG. 3 wherein the DFB embodiment is shown, a grating layer 35 is disposed over the total length of the GaAs active layer 27. The pitch of the grating or corrugation 35 provides the frequency discrimination for the laser and determines the frequency at which the laser will lase by providing feedback into the cavity. This is referred to as the "optical dispersion" of the grating in which the grating exhibits a reflectivity which is dependent upon the wavelength of the laser light.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

I claim:

1. A helium magnetometer comprising:
    (a) an enclosure containing an isotope of helium;
    (b) means for providing a discharge for exciting said isotope to a metastable level;
    (c) a radiation detector position adjacent said enclosure; and
    (d) a single line radiation light source comprising one of a (single mode), or (distributed feedback) or distributed Bragg reflection laser for directing a beam of light through said enclosure to said radiation detector.

2. The magnetometer of claim 1 wherein said single line radiation source is a laser of semiconductor material.

3. The magnetometer of claim 2 wherein the semiconductor material of said laser is InGaAs.

4. The magnetometer of claim 2 wherein said laser of semiconductor material includes built-in wavelength discrimination.

5. The magnetometer of claim 3 wherein said laser of semiconductor material includes built-in wavelength discrimination.

6. The magnetometer of claim 2 wherein said laser includes an active region through which the laser light travels, said laser further including adjacent said active region an epitaxial layer including a grating of predetermined pitch therein distributed along the length of the active region.

7. The magnetometer of claim 3 wherein said laser includes an active region through which the laser light travels, said laser further including adjacent said active region an epitaxial layer including a grating of predetermined pitch therein distributed along the length of the active region.

8. The magnetometer of claim 4 wherein said laser includes an active region through which the laser light travels, said laser further including adjacent said active region an epitaxial layer including a grating of predetermined pitch therein distributed along the length of the active region.

9. The magnetometer of claim 5 wherein said laser includes an active region through which the laser light travels, said laser further including adjacent said active region an epitaxial layer including a grating of predetermined pitch therein distributed along the length of the active region.

10. The magnetometer of claim 2 wherein said laser includes an active region through which the laser light travels and a grating disposed in juxtaposition with said active region in said semiconductor but isolated from the injection current region of said active region.

11. The magnetometer of claim 3 wherein said laser includes an active region through which the laser light travels and a grating disposed in juxtaposition with said active region in said semiconductor but isolated from the injection current region of said active region.

12. The magnetometer of claim 4 wherein said laser includes an active region through which the laser light travels and a grating disposed in juxtaposition with said active region in said semiconductor but isolated from the injection current region of said active region.

13. The magnetometer of claim 5 wherein said laser includes an active region through which the laser light travels and a grating disposed in juxtaposition with said active region in said semiconductor but isolated from the injection current region of said active region.

14. A method of measuring the intensity of a magnetic field comprising the steps of:
    (a) providing a helium magnetometer comprising:
        (i) an enclosure containing an isotope of helium;
        (ii) means for providing a discharge for exciting said isotope to a metastable level;
        (iii) a radiation detector position adjacent said enclosure; and
        (iv) a single line radiation light source comprising one of a single mode, or distributed feedback or distributed Bragg reflection laser for directing a beam of laser light through said enclosure to said radiation detector; and
    (b) measuring the intensity of said beam of laser light at said radiation detector.

15. The method of claim 14 wherein said single line radiation source is a laser of semiconductor material.

16. The method of claim 15 wherein said semiconductor material is InGaAs.

17. The method of claim 15 wherein said laser includes built-in wavelength discrimination.

18. The method of claim 16 wherein said laser includes built-in wavelength discrimination.

19. The method of claim 15 wherein said laser includes an active region through which the laser light travels, said laser further including adjacent said active region an epitaxial layer including a grating of predetermined pitch therein distributed along the length of the active region.

20. The method of claim 16 wherein said laser includes an active region through which the laser light travels, said laser further including adjacent said active region an epitaxial layer including a grating of predetermined pitch therein distributed along the length of the active region.

21. The method of claim 15 wherein said laser includes an active region through which the laser light travels and a grating disposed in juxtaposition with said active region in said semiconductor but isolated from the injection current region of said active region.

22. The method of claim 16 wherein said laser includes an active region through which the laser light travels and a grating disposed in juxtaposition with said active region in said semiconductor but isolated from the injection current region of said active region.

* * * * *

UNITED STATES PATENT AND TRADEMARK OFFICE
CERTIFICATE OF CORRECTION

PATENT NO. : 5,602,475

DATED : February 11, 1997

INVENTOR(S) : Christopher L. Bohler

It is certified that error appears in the above-identified patent and that said Letters Patent is hereby corrected as shown below:

Column 1, line 3, insert--

NOTICE

This invention was made with Government support under Contract No. N66001-93-C-600 awarded by the Department of the Navy. The Government has certain rights in this invention.

Signed and Sealed this

Tenth Day of April, 2001

Attest:

NICHOLAS P. GODICI

*Attesting Officer*   Acting Director of the United States Patent and Trademark Office